United States Patent [19]

Shiba et al.

[11] 4,173,477
[45] Nov. 6, 1979

[54] PHOTOGRAPHIC MATERIAL WITH DEVELOPER IN AZX EMULSION AND SUBLAYER

[75] Inventors: Keisuke Shiba, Shizuoka; Kikuo Kubotera; Akira Kashiwabara, both of Asaka, all of Japan

[73] Assignee: Fuji Photo Film Co., Ltd., Minami-ashigara, Japan

[21] Appl. No.: 816,764

[22] Filed: Jul. 18, 1977

[30] Foreign Application Priority Data

Jul. 16, 1976 [JP] Japan .................................. 51-84861

[51] Int. Cl.$^2$ .......................... G03F 7/02; G03C 1/48
[52] U.S. Cl. .................................... 430/264; 430/265; 430/496; 430/207; 430/609; 430/566
[58] Field of Search ............. 96/33, 66 R, 29 L, 76 R, 96/67

[56] References Cited

U.S. PATENT DOCUMENTS

| | | | |
|---|---|---|---|
| 2,875,020 | 2/1959 | Ring | 21/7 |
| 3,146,104 | 8/1964 | Yackel et al. | 96/33 |
| 3,146,105 | 8/1964 | Wrisley et al. | 96/33 |
| 3,326,685 | 2/1965 | Abbott et al. | 96/33 |
| 3,467,546 | 9/1969 | Page et al. | 118/50 X |
| 3,595,182 | 7/1971 | Clapp | 21/63 X |
| 3,600,166 | 8/1971 | Sieg et al. | 96/36.3 |
| 3,679,412 | 7/1972 | Guthrie et al. | 96/33 |
| 3,698,901 | 10/1972 | Elins et al. | 96/33 |
| 3,779,797 | 12/1973 | Makinen | 427/297 |
| 3,834,329 | 9/1974 | Suggitt et al. | 21/63 X |
| 3,987,219 | 10/1976 | Arvidsson | 427/297 |
| 4,018,605 | 4/1977 | Olsen | 96/29 L |
| 4,038,077 | 7/1977 | Land | 96/29 R |
| 4,060,953 | 12/1977 | Milne | 427/297 X |

FOREIGN PATENT DOCUMENTS

669489 12/1938 Fed. Rep. of Germany .......... 427/440

*Primary Examiner*—Edward C. Kimlin
*Attorney, Agent, or Firm*—Sughrue, Rothwell, Mion, Zinn and Macpeak

[57] ABSTRACT

A silver halide photographic material comprising an aluminum support having thereon an anodized aluminum oxide layer and a light sensitive silver halide layer containing a silver halide developing agent thereon with a subbing layer containing at least either a silver halide or a developing agent suitable for a silver halide in an amount less than the quantity contained in the light-sensitive layer, which can be used to produce a relief image possessing high printing durability by successively receiving an image-wise exposure, an alkaline solution development, a washing-off and a drying.

27 Claims, 1 Drawing Figure

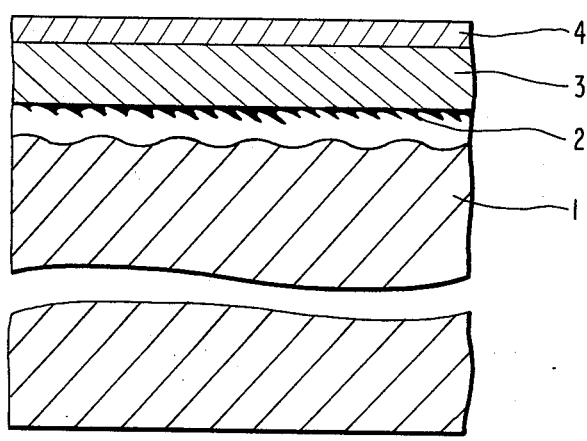

PHOTOGRAPHIC MATERIAL WITH DEVELOPER IN AZX EMULSION AND SUBLAYER

BACKGROUND OF THE INVENTION

1. Field of the Invention

The present invention relates to silver halide photographic materials having an aluminum support and, particularly, to those which contain a developing agent in some of the light sensitive layers and can provide images with an improved physical strength.

2. Description of the Prior Art

Photographic materials comprising an aluminum support having silver halide emulsion layers thereon are known as lithographic printing materials. The application of photographic materials of this type to lithographic printing materials is, for instance, disclosed in U.S. Pat. Nos. 3,146,104; 3,577,238 and so on. Various approaches have also been proposed with the intention of improving the printing durability of such materials, as disclosed in; for example, U.S. Pat. Nos. 3,650,742; 3,669,018 and so on. The burning-in treatment adopted therein increases the printing durability of such materials, but requires much time and labor. Moreover, silver halide photographic materials in which a tanning developing agent is incorporated therein are known. However, relief images produced by these approaches tend to be damaged and to delaminate from a support.

SUMMARY OF THE INVENTION

A main object of the present invention to eliminate these disadvantages.

A further object of the present invention is to provide a silver halide photographic material which can be easily developed with an alkaline solution and which can be used to produce an image having a high physical strength.

Another object of the present invention is to provide an original plate for lithographic printing which possesses high printing durability using the procedures of developing an image-wise exposed silver halide photographic material with an alkaline solution, washing the material, drying the material then subjecting the material to other optional treatments.

A further object of the present invention is to provide a highly sensitive pre-sensitized printing plate suitable for long run printing.

These and other objects will be apparent from the following detailed description of the invention.

These objects of the invention are accomplished with a silver halide photographic material comprising a support having thereon an anodized aluminum oxide layer, a subbing layer on the anodized aluminum oxide layer on the support and a light-sensitive silver halide layer containing a silver halide developing agent, in which the subbing layer contains at least either a silver halide or a silver halide developing agent in an amount less than the quantity contained in the light-sensitive layer.

That is to say, since the quantity of silver halide contained in the light sensitive layer ranges from about 1 millimole/m$^2$ to about 500 millimole/m$^2$ per $\mu$ of the dry thickness of the light sensitive layer, while the quantity of a developing agent contained in the light sensitive layer ranges from about 0.1 mole to about 10 mole per mole of silver halide and in other words, from 0.2 millimole/m$^2$ to 500 millimole/m$^2$, the amount of the silver halide or the developing agent preferably added to the subbing layer must be less than the above-described content.

BRIEF DESCRIPTION OF THE ACCOMPANYING DRAWING

The FIGURE shows a sectional view of a silver halide photographic material constructed according to the present invention, wherein 1 represents a support; 2, a subbing layer; 3, a light sensitive layer; and 4 a protective layer.

DETAILED DESCRIPTION OF THE INVENTION

Suitable examples of aluminum supports which can be used in the present invention include supports of pure aluminum and of aluminum alloys. A variety of alloys can be used including these containing silicon, copper, manganese, magnesium, chromium, zinc, lead, bismuth, nickel, etc. Some representative examples of suitable alloy compositions are shown in the following table. In the table, the values given are percent by weight, with the remainder being aluminum.

| Alloys No. | Compositions of Typical Aluminum Alloys | | | | | |
|---|---|---|---|---|---|---|
| | Si | Cu | Mn | Mg | Cr | Zn |
| 2S | 0.4 | — | — | 0.6 | — | — |
| 3S | — | — | 1.2 | — | — | — |
| 24S | — | 4.5 | 0.6 | 1.5 | — | — |
| 52S | — | — | — | 2.5 | 0.25 | — |
| 61S | 0.6 | 0.25 | — | 1.0 | 0.25 | — |
| 75S | — | 1.60 | — | 2.50 | 0.30 | 5.60 |

These compositions generally include, in addition, small amounts of Fe and Ti and negligible amounts of impurities not shown in the table.

The surface of an aluminum support is usually subjected to chemical cleaning such as a degreasing with solvents or alkaline agents, as described in detail in *KINZOKU HYOMEN GIJUTSU BINRAN* (*A Handbook on Metallic Surfaces*) p. 86–210, Nikkan Kogyo Shinbunsha, Tokyo (1969), for the purpose of exposing a clean surface free of grease, rust or dust which is usually present on the aluminum surface. Depending on the requirement, the surface is grained. Suitable graining methods which can be used include glass bead graining, ball graining, sand blasting, brush graining as described in Japanese Patent Application (OPI) No. 33411/73, electrolytic graining as described in Japanese Patent Application (OPI) No. 28123/73 and British Patent 896,563, etc. Any of these methods can be employed, however, graining is not always necessary and a polished surface of aluminum can be used as the printing surface of an offset printing support, although a grained support for offset printing exhibits a better water retention, thus giving preferred printed materials. Further, following the graining operation, according to the requirements, a treatment of the aluminum with an aluminum etching agent can be used in order to reduce background staining, as is set forth in Japanese Patent Application (OPI) No. 49501/73.

An anodized oxide layer is then formed on the thus conditioned aluminum plate. When an electric current is passed through the aluminum support immersed as a cathode in a solution containing one or more acids selected from sulfuric acid, phosphoric acid, chromic acid, oxalic acid, sulfamic acid, benzenesulfonic acid, etc., an anodized oxide coating is formed on the surface of the aluminum support.

Typical anodizing conditions, of course, depend on the composition of the electrolytic solution used and thus cannot be defined unequivocally. In general, suitable anodizing conditions are as follows: acid concentration: about 1 to 80% by weight; temperature of solution: about 5° to 70° C.; current density: about 0.5 to 60 amp/dm$^2$; voltage: about 1 to 100 volts; period of electrolysis: about 30 sec to 5 min. Suitable anodizing procedures are disclosed in, for example, U.S. Pat. Nos. 3,808,000; 3,181,461; 3,280,734; and 3,511,661. The following table summarizes suitable processing conditions in greater detail.

| Electrolytic Solution | Solution Concentration (%) | Temperature (°C.) | Current Density (A/dm$^2$) | Voltage (V) | Period (min) |
|---|---|---|---|---|---|
| Sulfuric Acid | 1–70 | 5–65 | 0.5–30 | —1–50 | 1–30 |
| Oxalic Acid | 1–20 | 20–60 | 0.5–20 | 10–70 | 5–40 |
| Phosphoric Acid | 2–60 | 20–60 | 0.5–20 | 10–60 | 1–30 |
| Chromic Acid | 2–30 | 30–60 | 0.5–10 | 10–60 | 1–50 |

In the anodization, pores are formed in the surface of the aluminum. A preferred pore size ranges from about 50 to about 1000 Å. The aluminum oxide produced by the anodic oxidation treatment is a thin layer having a thickness of about 0.01$\mu$ to about 15$\mu$, preferably 0.1$\mu$ to 10$\mu$. An anodized aluminum oxide layer which is additionally subjected to a graining treatment is preferably employed to advantage in the present invention. A laminate prepared by laminating the thus processed aluminum foil on a synthetic resin film or paper and particularly, papers having been treated to render them water proof using olefin series synthetic resins may be also employed as a support. A suitable thickness for the support preferably is about 0.05 to about 4 mm.

A dispersion prepared by dispersing both a light sensitive silver halide and a developing agent into a binder; for example, gelatin, a gelatin derivative and tanning developable polymers (having a primary amino group) such as polyacrylamide or a copolymer thereof can be used to produce the light sensitive layer in the present invention.

The silver halides, which can be used in the present invention, comprise silver halides such as silver bromide, silver iodide, silver chloride, or mixtures thereof, e.g. silver chlorobromide, silver iodobromide, and silver chloroiodobromide. The silver halide grains may be the type which form latent images either substantially in the interior of the grains or substantially at the surface of the grains. Of the silver halide grains of the type which form an internal latent image and which form substantially no latent image on the surface thereof, e.g., as disclosed in British Patent No. 1,385,039, silver halide crystals having a heterogeneous structure in which centers of free-electron traps are incorporated inside the crystal are preferred. A preferred mean diameter of the grains is from about 0.01$\mu$ to about 10$\mu$ and particularly, from 0.04$\mu$ to 2$\mu$. The silver halide emulsion can be prepared using any conventional method e.g., normal mixing method, reverse mixing method, controlled double jet method, controlled triple jet method etc.

To the silver halide emulsions as used in the present invention, conventionally used chemical sensitizing procedures can be applied. For instance, gold sensitization as described in U.S. Pat. Nos. 2,399,083, 2,597,856 and 2,597,915; reduction sensitization as described in U.S. Pat. Nos. 2,487,850 and 2,521,925; sulfur sensitization as described in U.S. Pat. Nos. 1,623,499 and 2,410,698; sensitization using different metal ions as described in U.S. Pat. Nos. 2,448,060, 2,566,245 and 2,556,263; and combinations of the above mentioned processes can be employed. A suitable (dry) thickness for the silver halide layer ranges from about 0.01 to about 20 $\mu$m, preferably 0.2 to 10 $\mu$m.

A preferred developing agent is a tanning developing agent (as described in C.E.K. Mees *The Theory of the Photographic Process*, Revised Ed. pages 580–584, Macmillan New York (1957)). The chemical structure of the developing agents is that they are benzenes or derivatives thereof each of which contains at least one hydroxy group and preferably, polyhydroxybenzenes substituted with halogen atoms such as chlorine, bromine, iodine or fluorine atoms; aryl groups; amino groups; $C_{1-6}$-alkyl groups or substituted alkyl groups; or/and alkoxy groups.

Specific examples of suitable developing agents of this kind include hydroquinone, toluhydroquinone, chlorohydroquinone, pyrogallol, resorcinol, hexylresorcinol, phloroglucinol, 4-benzylcatechol, 4-phenylcatechol and the like.

The subbing layer employed in the present invention is directly provided on the support. Examples of suitable binders which can be used for the subbing layer include hydrophilic colloids generally used in conventional silver halide emulsions, e.g., gelatin, gelatin derivatives, polymethacrylamide, polyvinyl alcohol, polyacrylic acid. Of these, a hydrophilic colloid capable of being tanned in development is preferred, and a hydrophilic colloid containing a primary amino group is particularly preferred. A pigment such as carbon black or titanium oxide, or a dye such as a phthalocyanine dye, a diazo dye, a triphenylmethane dye or the like can be further admixed with a binder which may be employed in producing the subbing layer, and in which at least either a silver halide or a silver halide developing agent has already been incorporated. A suitable amount of the dye or pigment which can be present in the subbing layer ranges from about 0.01 to about 10 g/m$^2$. A suitable amount of the silver halide and/or the silver halide developing agent incorporated in the subbing layer can range from about 0.01 to about 100 millimol/m$^2$ per $\mu$ of the dry thickness of the subbing layer. A material reducing the surface tension thereof should be added to the coating solution for producing the subbing layer so that the solution can permeate into pores prepared by the graining or the anodic oxidation treatment of the support. The coating solution is applied to the support as a layer in a dry thickness of about 0.01 to about 5 microns. Thus, the subbing layer is prepared.

At least either a silver halide or a silver halide developing agent employed in the present invention should be added to the coating solution for producing the subbing layer or the light sensitive layer in a form of an aqueous solution or an organic solvent solution. In addition to such solutions, a dispersion prepared by dispersing a solution of a silver halide or a silver halide developing agent dissolved in an organic solvent, which has a solubility in water less than about 40% by weight, into water or a hydrophilic colloid may be added to the coating solution for the subbing layer or the light sensitive layer. Therein, a dispersion aid such as tricresyl phosphate, N,N'-diethylcaprylamide, stearylamide, polyacrylamide copolymer or the like can be used in combination with the solution used. Where the developing agent is both water soluble and diffusible, the developing agent may be added to a light sensitive layer alone because the developing agent diffuses into the subbing layer adjacent the light sensitive layer.

In the photographic material of the present invention, a protective layer can be provided in addition to the subbing layer and the light sensitive layer on the support. A suitable protective layer can be a layer of a synthetic resin, as disclosed in Japanese Patent Application No. 71845/76, and an appropriate dry thickness can range from about 0.01 to about 20 μm, preferably 0.2 to 10 μm.

The photographic material of this invention is exposed and then processed to produce an image thereon. Suitable imagewise exposure techniques include contact exposure, enlarging exposure, etc. using radiation from light sources such as a tungsten lamp, a xenon lamp, a mercury lamp, electron beam irradiation. Suitable exposure times which can be used range from about $10^{-5}$ sec (flash exposure) to about 60 sec. A preferred exposure technique is an enlarging exposure to light from a tungsten lamp or a xenon lamp with a preferred exposure time being about 1 to about 10 sec or $10^{-5}$ sec of flash exposure to xenon light. Suitable processing solutions which can be used are aqueous alkaline solutions having preferably a pH of 9 to 12 which may also contain an antifoggant, a development accelerator, a preservative, etc. After development with the alkaline aqueous solution described above warm water at about 30° to 60° C. is used for the washing out and forming image areas. Such a washing-out solution can contain a pH buffer such as sodium sulfate, potassium sulfate, sodium sulfite, sodium phosphate, boric acid, borax ($Na_2B_4O_7 \cdot 10H_2O$) and a hardening agent such as potassium alum, sodium alum, chromium alum, sodium bichromate, etc.

The photographic material of the present invention can be employed for not only recording images and displaying images but also the production of a printing plate. In case of plate making, additional after-treatments including heating at a temperature of about 70° C. to about 300° C., exposure to infrared light, ultraviolet light or visible light, chemical treatment using a bichromate, a peroxide, a cobalt complex salt, an epoxy group-containing compound or the like, other than image-exposure, alkali development, washing-off and drying processings, are required. The photographic materials of the present invention can withstand these treatments.

The present invention will now be illustrated in greater detail by reference to the following example. However, the invention is not intended to be construed as being limited to this example. Unless otherwise indicated herein, all parts, percents, ratios and the like are by weight.

EXAMPLE

A 0.24 mm thick 2S aluminum plate was subjected to a degreasing treatment. Then, the plate was immersed into an aqueous solution of hydrochloric acid of a concentration of about 1%, through which an alternating current was passed for about 20 minutes under the conditions of an applied voltage of about 10 volts, at normal temperature (about 30° to 36° C.) and followed by the application of an anodic oxidation treatment in a 20% by weight aqueous solution of sulfuric acid at a direct current density of 1 Amp/dm² for 5 minutes. The thus processed aluminum plate was washed with water and dried. The resulting support was used as a support (designated by the reference numeral "1" in the FIGURE). A coating solution having either of compositions set forth below was applied to the support in dry coating amount of about 0.32 g/m² to provide a subbing layer (designated "2" in the attached FIGURE).

| Component | | | Sample No. | | | |
|---|---|---|---|---|---|---|
| | a | 1 | 2 | 3 | 4 | 5 |
| Gelatin (2% aq. soln.) (ml) | — | 12 | 30 | 30 | 12 | 25 |
| n-Propanol (ml) | — | 20 | 20 | 20 | 20 | 5 |
| Silver Iodobromide Emulsion (Grain diameter: 0.12 μ) (g) | — | 18 | — | — | 18 | — |
| Developing Agent (g) | — | 1* | 1* | 0.5** | 0.5** | — |

*Pyrogallol
**4-Phenylcatechol

A dispersion prepared according to the following process was coated on the subbing layer described above as a layer in a dry amount of about 2.53 g/m². The preparation of the dispersion is illustrated below: 1 g of 4-phenylcatechol was added to 2.5 ml of a 10% by weight ethylene chloride solution of a polymer having the repeating unit

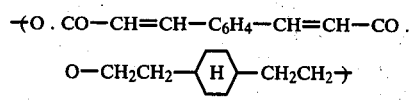

and a molecular weight of about 10,000 and dissolved therein. Next, 1.2 ml of 1% by weight aqueous solution of nonylphenylbenzene sulfonate was added to 38 g of a silver iodobromide emulsion (iodine content: about 2 mole%; silver salt content: 6.875 millimole and mean grain diameter: 0.12μ), to which the above-described ethylene chloride solution was added. Then, the solution was dispersed and an emulsion in the form of fine droplets was formed using a high-speed rotary mixer. Further, 50 ml of water was added to the resulting dispersion. Thus, a finished emulsion was prepared.

Moreover, a protective layer was provided on the light sensitive layer by coating a solution prepared by dissolving 0.8 g of the polymerization product obtained from the reaction of 2 moles of 4,4'-methylenediphenylisocyanate and 1 mole of hydroxyethylacrylate in a mixed solution of 12 ml of ethylene chloride and 8 ml of 2-methoxyethyl acetate on the light sensitive layer at the dry coverage of about 0.2 g/m².

After image-wise exposure, the thus obtained samples of the photographic materials were developed with the following alkaline solution for 90 seconds at a temperature of 24° C., washed out with warm water at 45° C. for a period of 30 seconds, and dried.

| Composition of Developer | |
|---|---|
| Sodium Carbonate (anhydrous) | 112.5 g |
| Potassium Bromide | 1.5 g |
| Sodium Polymetaphosphate | 1 g |
| Water to make | 1 l (pH=11.8) |

Printing with the lithographic printing plates was carried out using each of the thus obtained samples as original plates for printing and using a printing machine (ROTAPRINT R 40/K-30) using an ink (F-gloss type, produced by Toyo Ink Co., Ltd.). The results are illustrated in the table below.

| | Subbing Layer | | Light Sensitive Layer | | Characteristic | |
|---|---|---|---|---|---|---|
| Run No. | Developing Agent and Amount* | Amount* of Silver Halide | Developing Agent and Amount* | Amount* of Silver Halide | Ease of Plate Making | Quality of Impression |
| a | 0 | 0 | 1.41 | 1.79 | Difficult for Washing-off | Insufficient to receive ink for printing |
| 1 | Pyrogallol 3.20 | 1.33 | 1.41 | 1.79 | Easy | Good |
| 2 | Pyrogallol 5.0 | 0 | 1.41 | 1.79 | Easy | Good |
| 3 | 4-Phenyl-catechol 2.46 | 0 | 1.41 | 1.79 | Easy | Good |
| 4 | 4-Phenyl-cathechol 1.15 | 1.75 | 1.41 | 1.79 | Easy | Good |
| 5 | 0 | 0 (Containing Gelatin Water Solution and n-propanol) | 1.41 | 1.79 | Very Easy | Slightly Good |

*Millimole per micron of layer thickness on a dry basis.

In Sample a (employed as a comparison), it was difficult to wash-off the non-image areas. When it was necessary to forcibly remove the non-image areas by rubbing the image areas also were marred. In each of the samples used in Run Nos. 1, 2, 3, 4 and 5 a washing-off treatment was easily carried out. In particular, the sample used in Run No. 5 can be used to produce a plate with greater ease. Plates produced by using photographic materials employed in Run Nos. 1, 2, 3 and 4 withstand repeated printing procedures for 40,000 times without any accidents occurring. Samples used in Run Nos. 1 and 4 were particularly superior.

While the invention has been described in detail and with reference to specific embodiments thereof, it will be apparent to one skilled in the art that various changes and modifications can be made therein without departing from the spirit and scope thereof.

What is claimed is:

1. A silver halide photographic element comprising an aluminum support having thereon an anodized aluminum oxide layer, a subbing layer on the anodized aluminum oxide layer and a silver halide developing agent-containing light sensitive silver halide emulsion layer on the subbing layer, said subbing layer containing a silver halide and a silver halide developing agent in a molar amount less than the amount thereof contained in the light sensitive layer, wherein the said silver halide developing agent is 4-phenyl catechol and wherein said anodized aluminum oxide layer has been subjected to a graining treatment.

2. The silver halide photographic element of claim 1, said anodized aluminum oxide layer of the support having been subjected to a graining treatment.

3. The silver halide photographic element of claim 1, wherein said light-sensitive layer has a thickness from about 0.01 to about 20 $\mu$m.

4. The silver halide photographic element of claim 2, wherein said subbing layer has a thickness of from about 0.01 to about 5 microns.

5. The silver halide photographic element of claim 1, wherein said subbing layer has a thickness of from about 0.01 to about 5 microns.

6. The silver halide photographic element of claim 1, wherein said oxide layer has a thickness of about $0.01\mu$ about $15\mu$.

7. The silver halide photographic element of claim 1, wherein said oxide layer has a thickness of $0.1\mu$ to $10\mu$.

8. The silver halide photographic element of claim 6, wherein said oxide layer has a thickness of $0.1\mu$ to $10\mu$.

9. The silver halide photographic element of claim 2, wherein said silver halide has a mean diameter of from $0.04\mu$ to $2\mu$.

10. The silver halide photographic element of claim 9, wherein said silver halide has a mean diameter of $0.04\mu$ to $2\mu$.

11. The silver halide photographic element of claim 1, wherein said silver halide developing agent in the subbing layer is present in an amount from about 0.01 to about 100 millimol/m$^2$ per $\mu$ of the thickness of the subbing layer.

12. The silver halide photographic element of claim 6, wherein said silver halide developing agent in the subbing layer is present in an amount from about 0.01 to about 100 millimol/m$^2$ per $\mu$ of the thickness of the subbing layer.

13. The silver halide photographic element of claim 1, wherein said light-sensitive layer has a thickness of 0.2 to 10 $\mu$m.

14. The silver halide photographic element of claim 13, wherein said subbing layer has a thickness of from about 0.01 to about 5 microns.

15. The silver halide photographic element of claim 14, wherein said oxide layer has a thickness of $0.1\mu$ to $10\mu$.

16. The silver halide photographic element of claim 15, wherein said silver halide emulsion comprises silver halide grains having a mean diameter from $0.04\mu$ to $2\mu$.

17. The method for producing a lithographic printing plate which comprises (a) imagewise exposing a silver halide photographic element comprising an aluminum support having thereon, in order, an anodized aluminum oxide layer, a subbing layer and a silver halide light-sensitive emulsion layer 4-phenyl catechol as containing a silver halide tanning developing agent, said subbing layer containing said developing agent in a molar amount less than the quantity thereof in said emulsion layer, and said subbing layer containing silver halide in an amount less than the quantity thereof contained in said emulsion layer, (b) tanning developing the imagewise exposed element, to imagewise tan the emulsion layer, (c) washing off said developed element to remove untanned emulsion layer and then (d) drying the element, wherein said anodized aluminum oxide layer of the support has been subjected to a graining treatment.

18. The method of claim 17, wherein said emulsion layer has a thickness of about 0.01 to about 20 μm.

19. The method of claim 14, wherein said subbing layer has a thickness of about 0.01 to about 5 microns.

20. The method of claim 13, wherein said oxide layer has a thickness of $0.1\mu$ to $10\mu$.

21. The method of claim 20, wherein said developing agent in the subbing layer is present in an amount of from about 0.01 to about 100 millimol/m² per μ of the thickness of the subbing layer.

22. The method of claim 21, wherein said silver halide photographic element further has a protective layer having a thickness of 0.2 to 10 μm on said emulsion layer.

23. The method of claim 21, wherein said developing agent in the emulsion layer is present in an amount of from about 1 millimol/m² to 500 millimol/m² per μ of the thickness of the emulsion layer.

24. The method of claim 23, wherein said tanning development is carried out by treating said imagewise exposed element with an aqueous alkaline solution having a pH of 9 to 12.

25. The method of claim 23, wherein silver halide grains in said emulsion layer have a mean diameter of from $0.04\mu$ to $2\mu$.

26. The silver halide photographic element of claim 1, which further comprises a protective layer on said silver halide emulsion layer.

27. The silver halide photographic element of claim 1, wherein said developing agent is a tanning development agent.

* * * * *